United States Patent
Mathews

[19]

[11] Patent Number: 6,025,236
[45] Date of Patent: *Feb. 15, 2000

[54] METHODS OF FORMING FIELD OXIDE AND ACTIVE AREA REGIONS ON A SEMICONDUCTIVE SUBSTRATE

[75] Inventor: Viju K. Mathews, Boise, Id.

[73] Assignee: Micron Technology, Inc., Boise, Id.

[*] Notice: This patent is subject to a terminal disclaimer.

[21] Appl. No.: 09/282,284

[22] Filed: Mar. 31, 1999

Related U.S. Application Data

[63] Continuation of application No. 08/810,336, Feb. 27, 1997, Pat. No. 5,897,356.

[51] Int. Cl.<sup>7</sup> .......................... H01L 21/76; H01L 21/265
[52] U.S. Cl. .......................... 438/297; 438/225; 438/443
[58] Field of Search ................................ 438/297, 443, 438/224

[56] References Cited

U.S. PATENT DOCUMENTS

| | | | |
|---|---|---|---|
| 4,516,316 | 5/1985 | Haskell | 29/576 |
| 5,393,693 | 2/1995 | Ko et al. | 438/297 |
| 5,496,750 | 3/1996 | Mosiehi | 438/297 |
| 5,604,157 | 2/1997 | Dai et al. | 438/297 |
| 5,728,620 | 3/1998 | Park | 438/297 |
| 5,736,451 | 4/1998 | Gayet | 438/443 |

FOREIGN PATENT DOCUMENTS 63-55954  3/1988  Japan .

OTHER PUBLICATIONS

*Silicon Processing for the VLSI Era*, S. Wolf, vol. 2, Chap. 2.

*Primary Examiner*—Chandra Chaudhari
*Assistant Examiner*—David S Blum
*Attorney, Agent, or Firm*—Wells, St. John, Roberts, Gregory & Matkin P.S.

[57] ABSTRACT

Methods of forming a field oxide region and an adjacent active area region are described. A semiconductive substrate is masked with an oxidation mask while an adjacent area of the substrate remains unmasked by the oxidation mask. The substrate is exposed to conditions effective to form a field oxide region in the adjacent area. The field oxide region has a bird's beak region which extends toward the active area. In accordance with a first implementation, a portion of the semiconductive substrate is removed after removal of the oxidation mask but before the formation and removal of a sacrificial oxide layer. In accordance with this implementation, removal of the semiconductive substrate material forms an undercut region under the bird's beak region which is subsequently filled in with material when the sacrificial oxide layer is formed. In accordance with a second implementation, a portion of the semiconductive substrate is removed after formation and removal of the sacrificial oxide layer. In accordance with this implementation, removal of the semiconductive substrate material forms an undercut region under the bird's beak region which is subsequently filled in with material when the gate dielectric layer is formed.

1 Claim, 7 Drawing Sheets

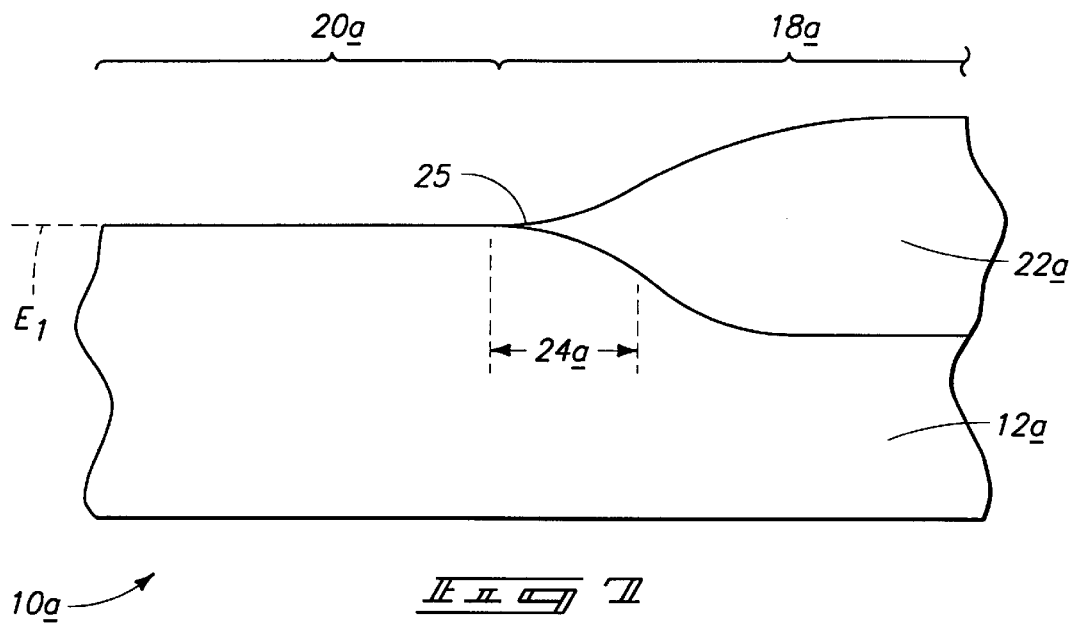
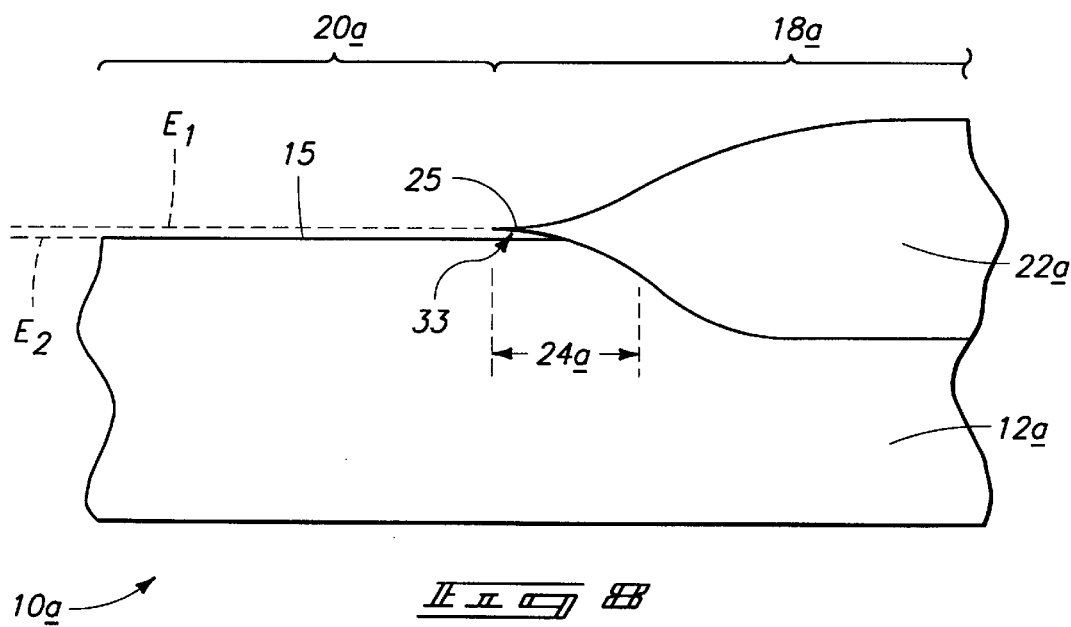

METHODS OF FORMING FIELD OXIDE AND ACTIVE AREA REGIONS ON A SEMICONDUCTIVE SUBSTRATE

RELATED PATENT DATA

This patent application is a continuation resulting from U.S. patent application Ser. No. 08/810,336, which was an application filed on Feb. 27, 1997, now U.S. Pat. No. 5,897,356.

TECHNICAL FIELD

This invention relates to methods of forming field oxide and adjacent active area regions on a semiconductive substrate.

BACKGROUND OF THE INVENTION

Integrated circuits are typically fabricated over a semiconductive substrate and can include many individual transistor or device constructions. Implementing electrical circuits involves connecting isolated devices through specific electrical paths. It must, therefore, be possible to isolate respective transistor or device constructions. A variety of techniques have been developed to isolate devices in integrated circuits. One technique, termed LOCOS isolation (for LOCal Oxidation of Silicon) involves the formation of a semi-recessed oxide in the nonactive (or field) areas of the substrate. Prior art LOCOS isolation is discussed briefly in this section as such pertains to the present invention. For a more detailed discussion of LOCOS isolation, the reader is directed to a text by Wolf entitled, "Silicon Processing for the VLSI Era", Vol. 2, Chapter 2, the disclosure of which is hereby incorporated by reference.

Referring to FIG. 1, a prior art semiconductor wafer fragment in process is indicated generally by reference numeral 10. Such comprises a semiconductive substrate 12 over which a field oxide or isolation oxide region is to be formed by LOCOS techniques. In the context of this document, the term "semiconductive substrate" is defined to mean any construction comprising semiconductive material, including, but not limited to bulk semiconductive material such as semiconductive wafer (either along or in assemblies comprising other materials thereon) and semiconductive material layers (either alone or in assemblies comprising other materials). The term "substrate" refers to any supporting structure, including, but not limited to, the semiconductive substrates described above. A pad oxide layer 14 is formed over substrate 12 and an oxidation mask 16, comprises of a suitable material such as silicon nitride, is formed over pad oxide layer 14. Portions of layers 14, 16 (not shown) have been removed to expose a substrate portion 18. Portion 18 constitutes a portion of the substrate in which a LOCOS isolation structure or isolation oxide region is to be formed. Adjacent substrate portion 18, a masked substrate portion 20 remains. Portion 20 constitutes at least a portion of the substrate which is to support at least one integrated circuit construction. Accordingly, such portion constitutes an active area.

Referring to FIG. 2, substrate 12 is exposed to oxidation conditions which are sufficient to form oxide isolation region or field oxide region 22 within portion 18. Accordingly, as is known, the formation of region 22 typically causes a bird's beak region 24 to be formed, a portion of which extends under and upwardly lifts oxidation mask 16.

Referring to FIG. 3, oxidation mask 16 and pad oxide layer 14 are suitably removed or etched. Such defines a more pronounced bird's beak in region 24.

Referring to FIG. 4, a sacrificial oxide layer 26 is formed over substrate 12 typically to overcome a phenomena known as the Kooi effect. During the growth of field oxide, the Kooi effect can cause later defects when a gate oxide is formed. More specifically, during field oxide growth, a thin layer of silicon nitride can form on the silicon surface and close to the border of the active regions as a result of the reaction between the oxidizing species, oxygen and water, and the silicon nitride. In particular, $NH_3$ is generated from the reaction between the water and the masking nitride during the field oxidation step. This $NH_3$ then diffuses through the oxide and reacts with the silicon substrate to form silicon-nitride ribbons. When the nitride mask and pad oxide are removed, there is a possibility that the silicon-nitride ribbon remains present. When gate oxide is subsequently grown, the growth rate becomes impeded at the locations where such silicon-nitride ribbons remain. The gate oxide is thus thinner at these locations than elsewhere giving rise to problems associated to low voltage breakdown of the gate oxide. The most widely used method of eliminating the silicon-nitride ribbon problem is to grow a sacrificial oxide layer, typically about 25 to about 50 nanometers thick, after stripping the masking nitride and pad oxide. This sacrificial oxide layer is then removed by wet etching before growing the final gate oxide.

It has been found that the removal of the prior formed pad oxide layer 14 (FIG. 2) together with the formation and removal of the sacrificial oxide layer 26 can lead to a slightly thinner region 28 adjacent oxide isolation region 22 when the gate oxide layer is ultimately formed.

Referring to FIG. 5, and prior to formation of a gate oxide layer, sacrificial oxide layer 26 is suitably removed. In the illustrated example, such can cause field oxide region 22 to be recessed to a degree which results in the formation of a convex bump 30 laterally adjacent oxide isolation region 22.

Referring to FIG. 6, a gate oxide layer 32 is formed over substrate 12. Oxidation of bump 30 results in localized thinning of the gate oxide within region 28. Such thinning can lead to device failure brought on by gate shorting.

This invention arose out of concerns associated with improving the processing of semiconductor devices. This invention also arose out of concerns associated with improving the uniformity with which semiconductor devices can be formed.

SUMMARY OF THE INVENTION

Methods of forming a field oxide region and an adjacent active area region are described. A semiconductive substrate is masked with an oxidation mask while an adjacent area of the substrate remains unmasked by the oxidation mask. The substrate is exposed to conditions effective to form a field oxide region in the adjacent area. The field oxide region has a bird's beak region which extends toward the active area. In accordance with a first implementation, a portion of the semiconductive substrate is removed after removal of the oxidation mask but before the formation and removal of a sacrificial oxide layer. In accordance with this implementation, removal of the semiconductive substrate material forms an undercut region under the bird's beak region which is subsequently filled in with material when the sacrificial oxide layer is formed. In accordance with a second implementation, a portion of the semiconductive substrate is removed after formation and removal of the sacrificial oxide layer. In accordance with this implementation, removal of the semiconductive substrate material forms an undercut region under the bird's beak region which is subsequently filled in with material when the gate dielectric layer is formed.

BRIEF DESCRIPTION OF THE DRAWINGS

Preferred embodiments of the invention are described below with reference to the following accompanying drawings.

FIG. 7 is a view of a semiconductor wafer fragment at a processing step which corresponds to the FIG. 3 processing step.

FIG. 8 is a view of the FIG. 7 wafer fragment at a subsequent processing step in accordance a first preferred implementation of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 3:
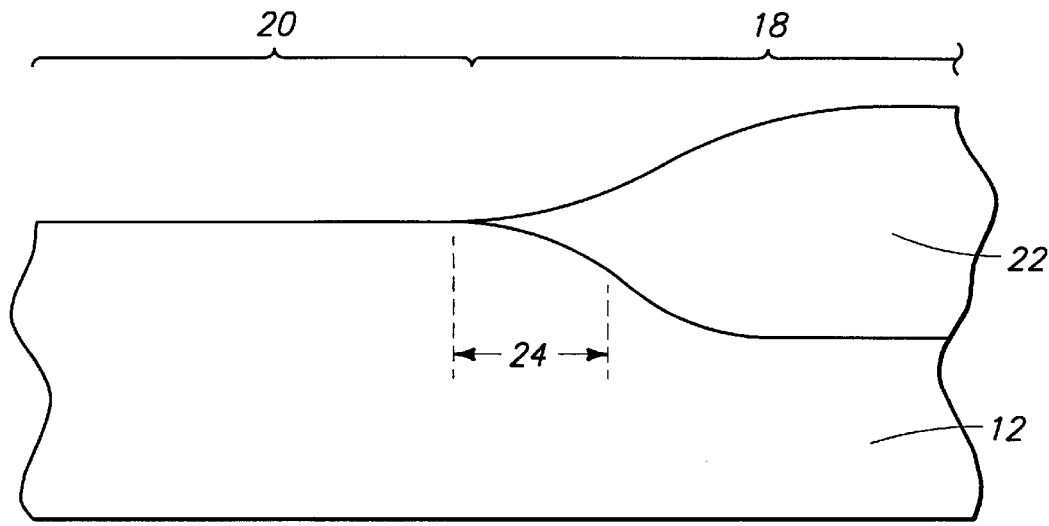
FIG. 3 is a view of the FIG. 1 wafer fragment at a prior art processing step subsequent to that shown by FIG. 2.
Figure 4:
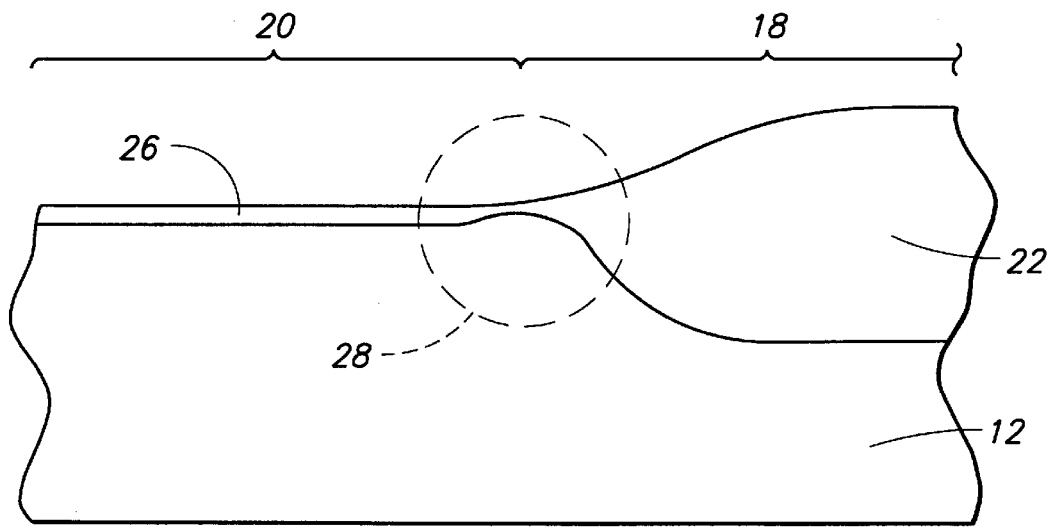
FIG. 4 is a view of the FIG. 1 wafer fragment at a prior art processing step subsequent to that shown by FIG. 3.

Like numbers from the above-described prior art embodiment are utilized where appropriate, with differences being indicated with the suffix "a" or with different numerals. Processing of the below-described semiconductor wafer fragment takes place in accordance with the above described methodology up to and including that which is shown in FIG. 3. It is at this point that the inventive departures begin.

Figure 1:
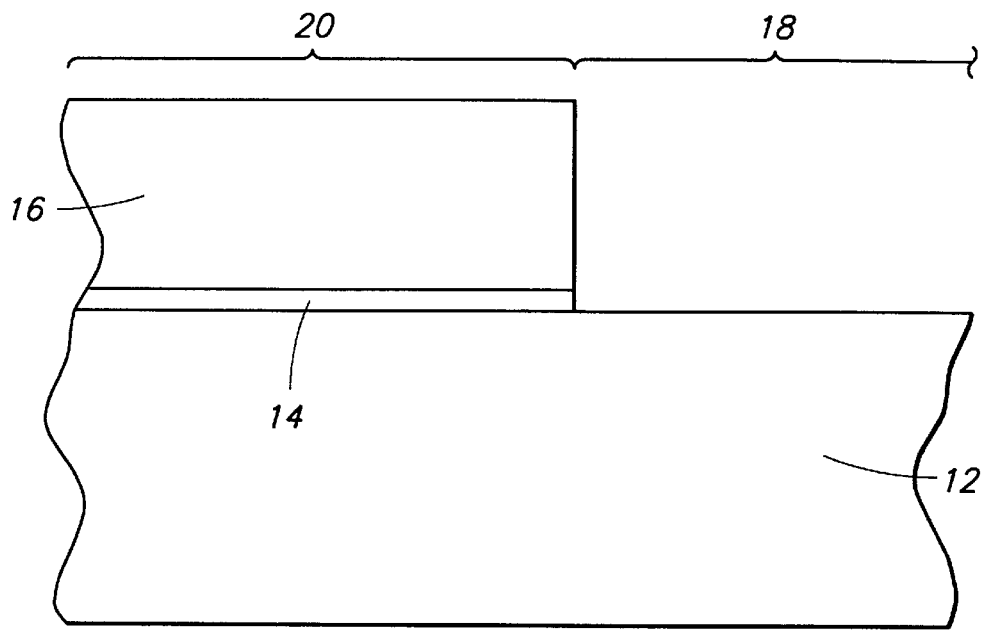
FIG. 1 is a diagrammatic sectional view of a semiconductor wafer fragment at one prior art processing step and is discussed in the "Background of the Invention" section above.
Figure 2:
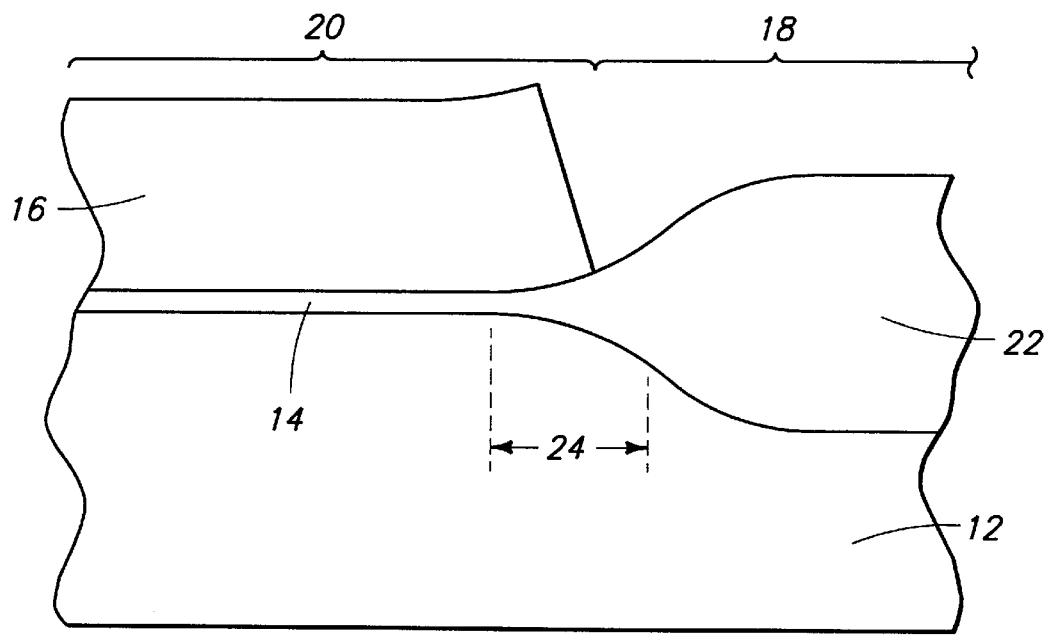
FIG. 2 is a view of the FIG. 1 wafer fragment at a prior art processing step subsequent to that shown by FIG. 1.

Referring to FIG. 7, a portion of a semiconductor wafer fragment in process is indicated generally at 10a. Such includes a semiconductive substrate 12a. The FIG. 7 construction is one which corresponds to the FIG. 3 construction which, as discussed above, constitutes a wafer fragment after removal of the pad oxide layer 26. It is of course possible, however, for a pad oxide layer not to be used. In such case, the FIG. 7 construction would constitute a wafer fragment after removal of an oxidation mask such as mask 16 in FIG. 2. Accordingly, a substrate portion 20a constitutes an active area portion which was previously masked with an oxidation mask similar to that which is shown at 16 in FIG. 2. Substrate portion 18a constitutes an adjacent area of the semiconductive substrate which was not previously masked with an oxidation mask during which time a field oxide or oxide isolation region 22a was formed. Accordingly during such processing, a bird's beak region 24a was formed to extend toward active area portion 20a. Oxide isolation region 22a, and more specifically bird's beak region 24a, includes a terminus 25 disposed laterally adjacent and joining with active area portion 20a. The joinder of terminus 25 with active area portion 20a defines surface at a first elevation indicated at $E_1$.

Referring to FIG. 8, and in accordance with a first preferred implementation, material of semiconductive substrate 12a is removed to form an outer conductive substrate surface 15 at a second elevation $E_2$ which is lower than or below first elevation $E_1$. As shown, the removing of the substrate material is conducted with field oxide region 22a and active area portion 20a being outwardly exposed. In accordance with one aspect of the invention, semiconductive substrate material is removed proximate terminus 25 and to a degree which is sufficient to undercut at least a portion of the bird's beak defining bird's beak region 24a. The removal of such substrate material forms, in the illustrated and preferred embodiment, a slot 33 between isolation region terminus 25 and underlying semiconductive material of substrate 12a. Preferably, the semiconductive substrate material is chemical etched substantially selective relative to the field oxide region to suitably form slot 33 without appreciably etching terminus 25 or the bird's beak. Such etching is preferably accomplished in the absence of any photoresist over the field oxide region or substrate active area. An exemplary etch chemistry includes dilute ammonium hydroxide ($NH_4OH$) or a mixture of $NH_4OH$ and hydrogen peroxide ($H_2O_2$).

Figure 9:
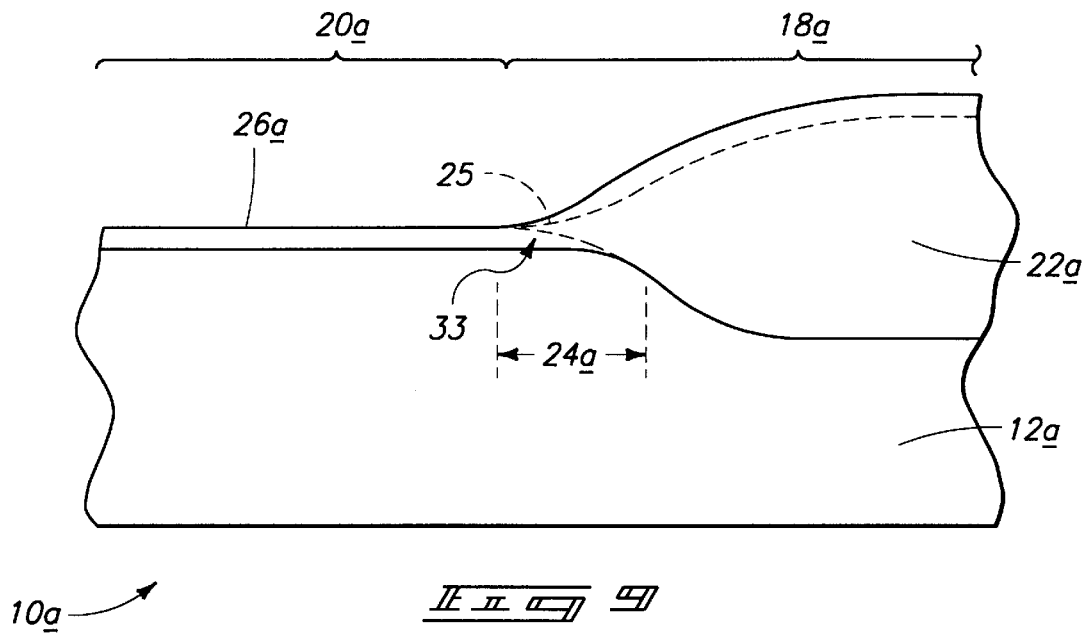
FIG. 9 is a view of the FIG. 8 wafer fragment at a processing step subsequent to that shown by FIG. 8.

Referring to FIG. 9, substrate 12a is subjected to oxidizing conditions which are effective to form a sacrificial oxide layer 26a over substrate active area 20a. At the same time, slot 33 is filled with insulative material which constitutes a portion of the sacrificial oxide layer. Such oxidizing conditions permit the growth of oxide insulative material to replace at least some of the semiconductive material which was etched away under terminus 25.

Figure 5:
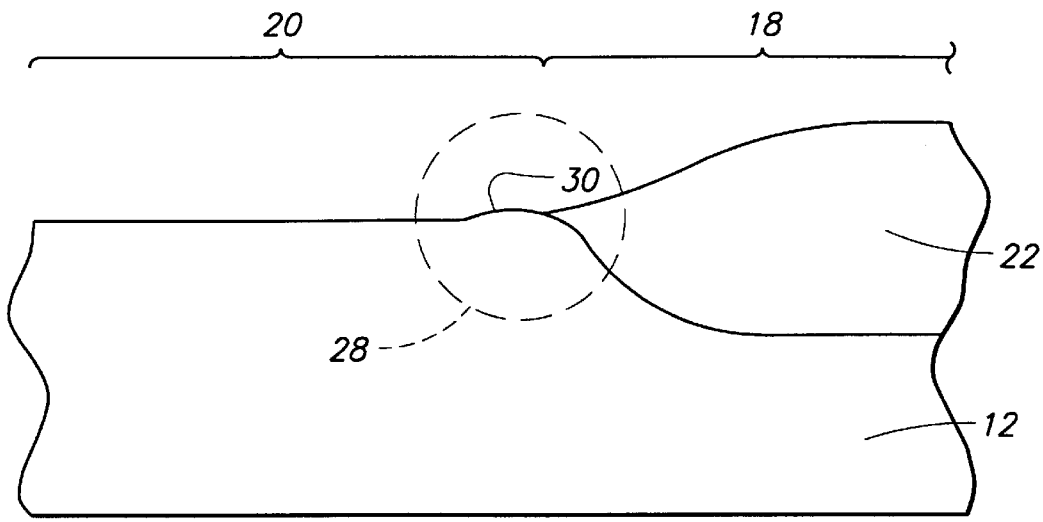
FIG. 5 is a view of the FIG. 1 wafer fragment at a prior art processing step subsequent to that shown by FIG. 4.
Figure 6:
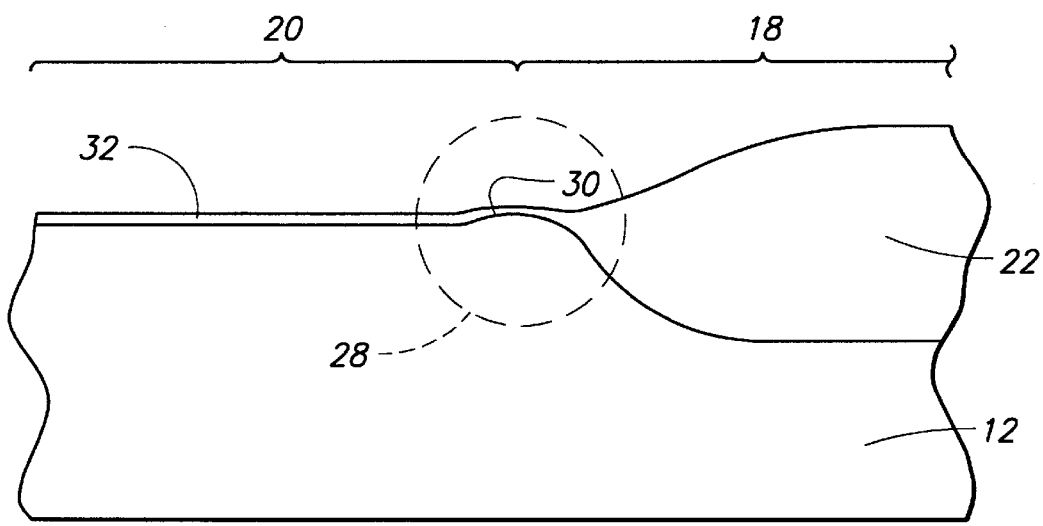
FIG. 6 is a view of the FIG. 1 wafer fragment at a prior art processing step subsequent to that shown by FIG. 5.
Figure 10:
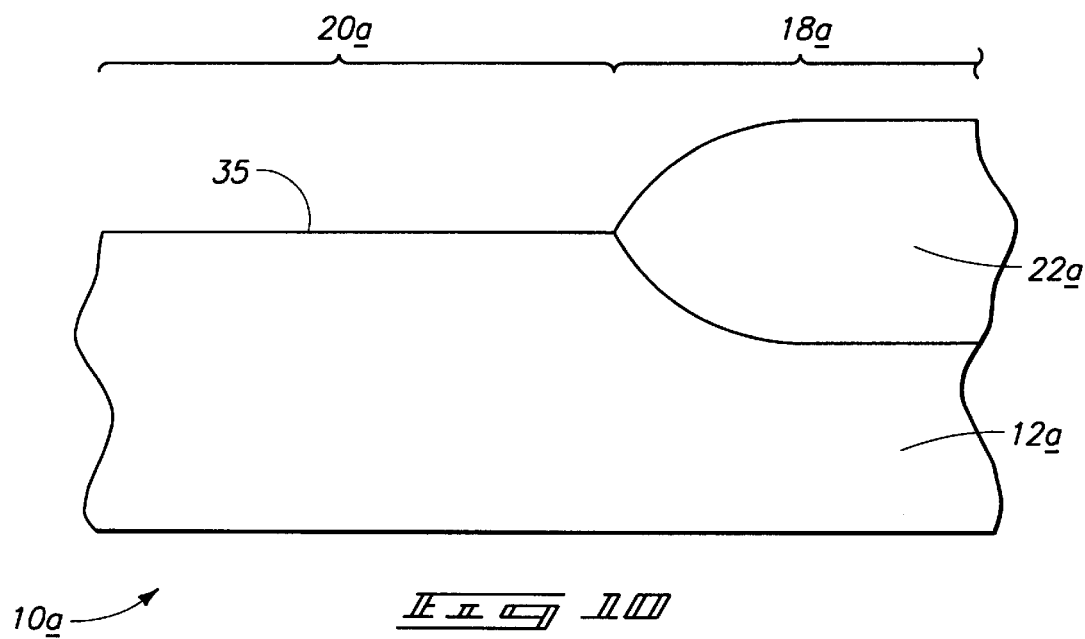
FIG. 10 is a view of the FIG. 8 wafer fragment at a processing step subsequent to that shown by FIG. 9.

Referring to FIG. 10, sacrificial oxide layer 26a is removed or otherwise stripped as by suitable etching from over active area portion 20a. Accordingly, a generally planar substrate surface 35 is outwardly exposed and displays little, if any, of the above-described convex bump 30 (FIG. 5).

Figure 11:
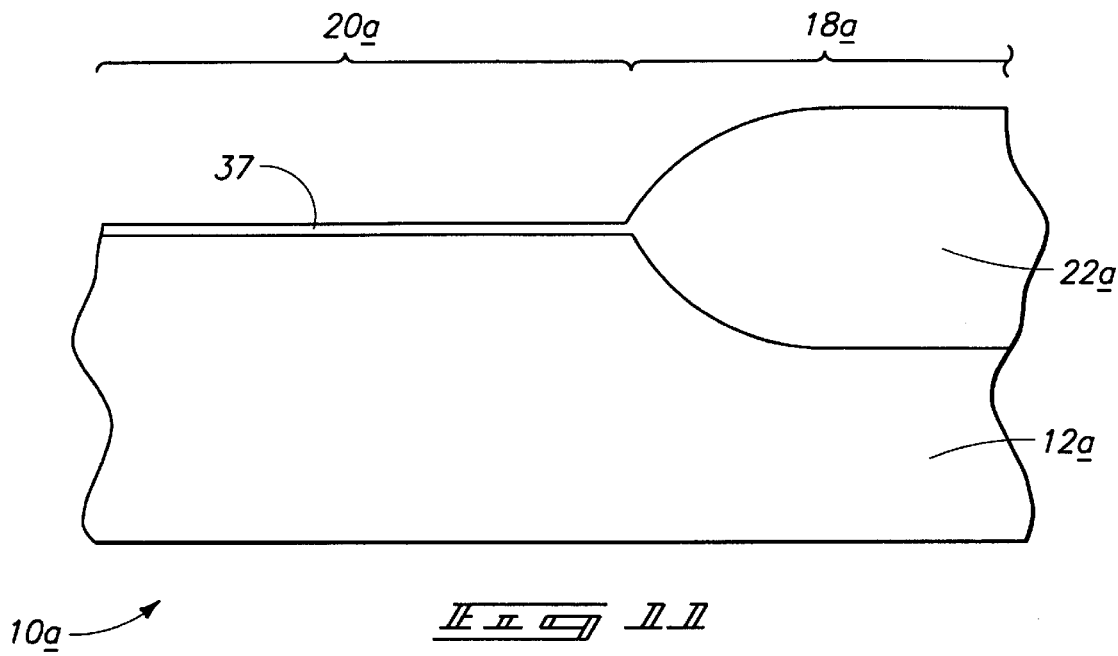
FIG. 11 is a view of the FIG. 8 wafer fragment at a processing step subsequent to that shown by FIG. 10.

Referring to FIG. 11, a gate dielectric layer 37 is formed over active area portion 20a. Further processing of wafer fragment 10a can take place in accordance with known processing techniques.

The above described implementation is one which constitutes removing a portion of the semiconductive substrate after the removal of the oxidation mask and pad oxide layer (in the event a pad oxide layer is even utilized), but before the formation and removal of the sacrificial oxide layer. In accordance with this implementation, removal of the semiconductive substrate material forms an undercut region which is subsequently filled in with material when the sacrificial oxide layer is formed. In the event a sacrificial oxide layer is not utilized, the undercut region will be filled in with material when the gate dielectric layer is formed.

Figure 12:
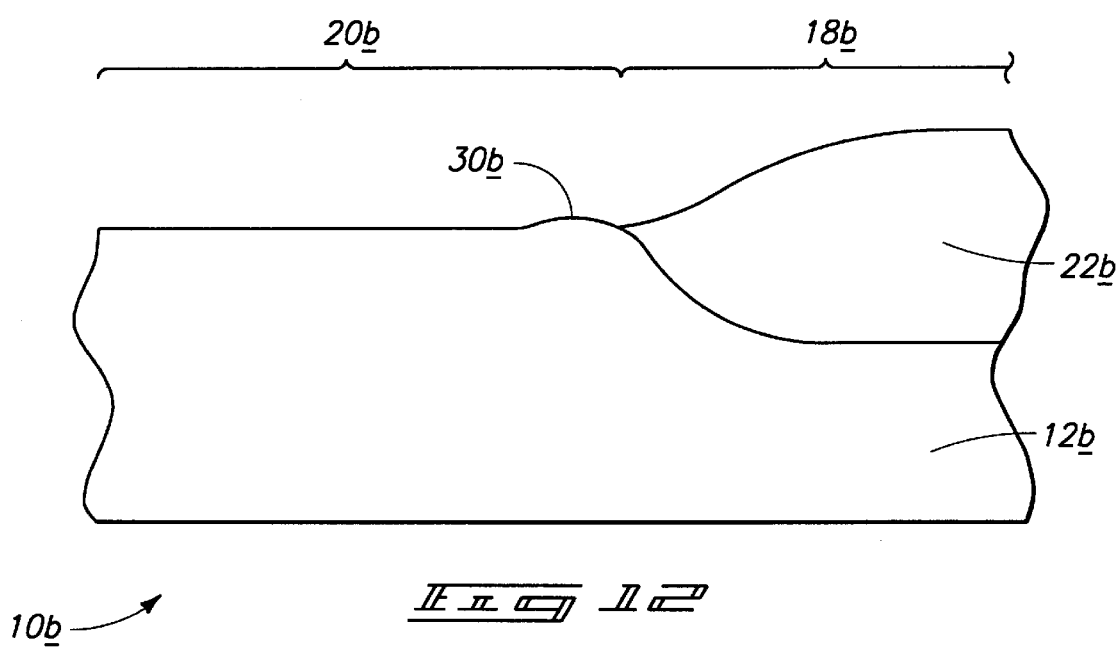
FIG. 12 is a view of a semiconductor wafer fragment at a processing step which corresponds to the FIG. 5 processing step.

Referring to FIG. 12, a second preferred implementation is set forth. Like numbers from the above-described prior art and inventive embodiments are utilized where appropriate, with differences being indicated with the suffix "b" or with different numerals. The starting point for the discussion immediately below corresponds to the FIG. 5 construction which is after the sacrificial oxide layer has been formed and removed. To that extent, processing of the illustrated FIG. 12 wafer fragment takes place in accordance with the above described processing relative to FIGS. 1–5. Accordingly, such results in the formation of a convex bump 30b of material within active area portion 20b proximate the field oxide region 22b.

Figure 13:
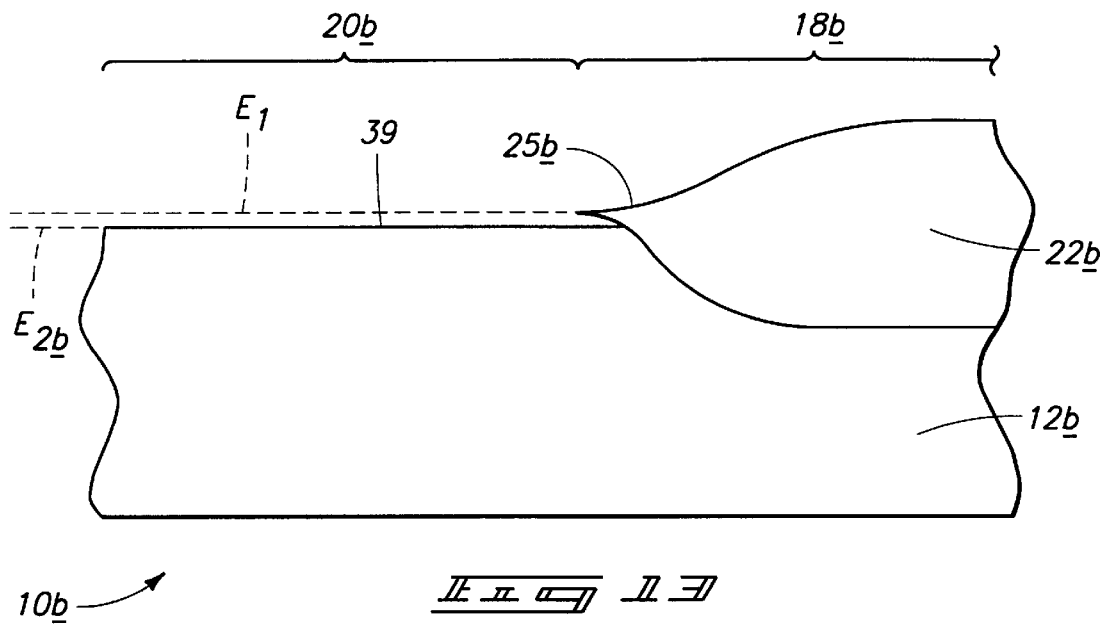
FIG. 13 is a view of the FIG. 12 wafer fragment at a subsequent processing step in accordance a second preferred implementation of the invention.

Referring to FIG. 13, and following the removal of the sacrificial oxide layer, material of substrate 12b in active area portion 20b is removed to provide a substantially planar substrate surface 39 within active area portion 20b. As shown, at least some and preferably all of convex bump 30b is removed during the removal of the semiconductive substrate material. In the illustrated and preferred embodiment, substrate material is chemical etched substantially selective relative to the material which constitutes oxide isolation region 22b. Such preferably does not appreciably etch the bird's beak region or terminus 25. Such preferred etching forms an outer semiconductive substrate surface at a second elevation $E_{2b}$ which is below first elevation $E_1$ (which corresponds to the point at which terminus 25 joins active area portion 20a).

Figure 14:
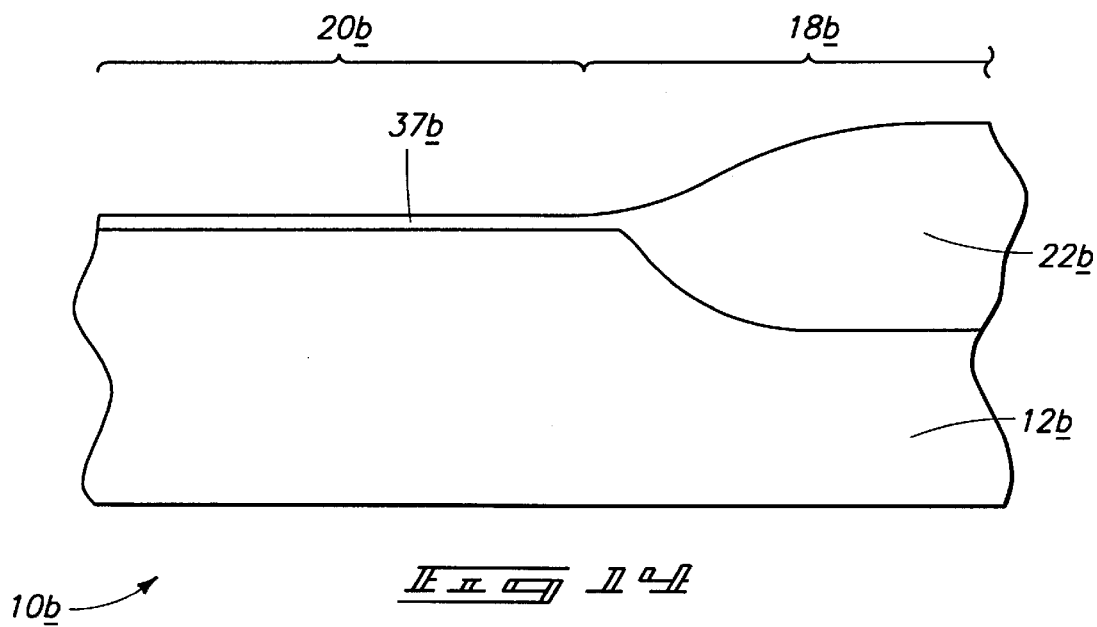
FIG. 14 is a view of the FIG. 13 wafer fragment at a processing step subsequent to that shown by FIG. 13.

Referring to FIG. 14, substrate 12b is subjected to conditions which are sufficient to form or grow gate dielectric layer 37b. As shown, the substrate material which was previously removed is replaced with insulative gate dielectric material.

The second described implementation is one which constitutes removing a portion of the semiconductive substrate after formation and removal of the sacrificial oxide layer. In accordance with this implementation, removal of the semiconductive substrate material forms an undercut region which is subsequently filled in with material when the gate dielectric layer is formed.

Either of the above described implementations can provide a gate dielectric layer which is more uniform in elevational thickness. Such stems from the fact that the above described methodology reduces if not eliminates either (1) the propensity of the convex bump to form (the first described implementation), or (2) the convex bump once formed (the second described implementation) proximate the joinder region of the isolation oxide and the substrate active area.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a substrate active area adjacent an oxide isolation region comprising:

forming an oxide isolation region over a semiconductive substrate proximate a semiconductive substrate active area, the isolation region having a portion extending to the active area;

after forming the oxide isolation region, removing material of the semiconductive substrate of the active area to a degree sufficient to form a slot between the isolation region portion and underlying semiconductive material; and filling the slot with insulative material.

* * * * *

UNITED STATES PATENT AND TRADEMARK OFFICE
CERTIFICATE OF CORRECTION

PATENT NO : 6,025,236
DATED : February 15, 2000
INVENTOR(S) : Viju K. Mathews

It is certified that error appears in the above-identified patent and that said Letters Patent are hereby corrected as shown below:

Col. 1, line 41
 replace "along"
 with --alone--.

Signed and Sealed this

Seventeenth Day of April, 2001

*Attest:*

NICHOLAS P. GODICI

*Attesting Officer*     *Acting Director of the United States Patent and Trademark Office*